United States Patent
Wu et al.

(10) Patent No.: US 7,208,336 B2
(45) Date of Patent: Apr. 24, 2007

(54) WHITE LIGHT EMITTING DEVICE AND METHOD OF MAKING SAME

(75) Inventors: Tung-Hsing Wu, Taichung (TW); Ray-Hua Horng, Taichung (TW); Meng-Chai Wu, Keelung (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 11/398,262

(22) Filed: Apr. 4, 2006

(65) Prior Publication Data

US 2006/0216845 A1    Sep. 28, 2006

Related U.S. Application Data

(63) Continuation of application No. 11/035,647, filed on Jan. 14, 2005, now Pat. No. 7,045,375.

(51) Int. Cl.
*H01L 21/00* (2006.01)
*H01L 33/00* (2006.01)

(52) U.S. Cl. .............................. 438/35; 438/34; 257/88; 257/89

(58) Field of Classification Search .................. 438/29, 438/32, 34, 35; 257/88, 89, 90, 93; 362/231
See application file for complete search history.

(56) References Cited

U.S. PATENT DOCUMENTS

| | | | |
|---|---|---|---|
| 5,684,309 A | 11/1997 | McIntosh et al. | 257/191 |
| 5,952,680 A | 9/1999 | Strite | 257/88 |
| 6,395,564 B1 | 5/2002 | Huang | 438/7 |
| 6,513,949 B1 | 2/2003 | Marshall et al. | 362/231 |
| 6,518,598 B1 * | 2/2003 | Chen | 257/91 |
| 6,576,933 B2 | 6/2003 | Sugawara et al. | 257/103 |
| 6,603,146 B1 * | 8/2003 | Hata et al. | 257/79 |
| 6,692,136 B2 | 2/2004 | Marshall et al. | 362/231 |
| 6,765,234 B2 * | 7/2004 | Koide | 257/88 |
| 6,872,607 B2 | 3/2005 | Tanaka | 438/166 |
| 2002/0068373 A1 | 6/2002 | Lo et al. | 438/33 |
| 2004/0089864 A1 | 5/2004 | Chi et al. | 257/79 |
| 2004/0090779 A1 | 5/2004 | Ou et al. | 362/231 |

OTHER PUBLICATIONS

Applied Physics Letters, vol. 75, No. 2; R. H. Horng et al.; "AlGaInP/AuBe/Glass Light-Emitting Diodes Fabricated by Wafer Bonding Technology"; pp. 154-155; Jul. 12, 1999.
IEEE, 0-7803-5410-9/99; X. Guo et al.; "Photon Recycling Semiconductor Light Emitting Diode"; pp. 600-603; 1999.
Japan J. Applied Physics, vol. 39, Part 1, No. 4B; R. H. Horng et al.; "Wafer-Bonded AlGaInP/Au/AuBe/SiO2/Si Light-Emitting Diodes"; pp. 2357-2359; Apr. 2000.

* cited by examiner

*Primary Examiner*—Kevin M. Picardat
(74) *Attorney, Agent, or Firm*—Ware, Fressola, Van Der Sluys & Adolphson LLP

(57) ABSTRACT

A white-light emitting device comprising a first PRS-LED and a second PRS-LED. The first PRS-LED has a primary light source to emit blue light and a secondary light source to emit red light responsive to the blue light; and the second PRS-LED has a primary light source to emit green light and a secondary light source for emitting red light responsive to the green light. Each of the primary light sources is made from an InGaN layer disposed between a p-type GaN layer and an n-type GaN layer. The secondary light sources are made from AlGaInP. The primary light source and the secondary light source can be disposed on opposite sides of a sapphire substrate. Alternatively, the second light source is disposed on the n-type GaN layer of the primary light source. The second light sources may comprise micro-rods of AlGaInP of same or different compositions.

21 Claims, 15 Drawing Sheets

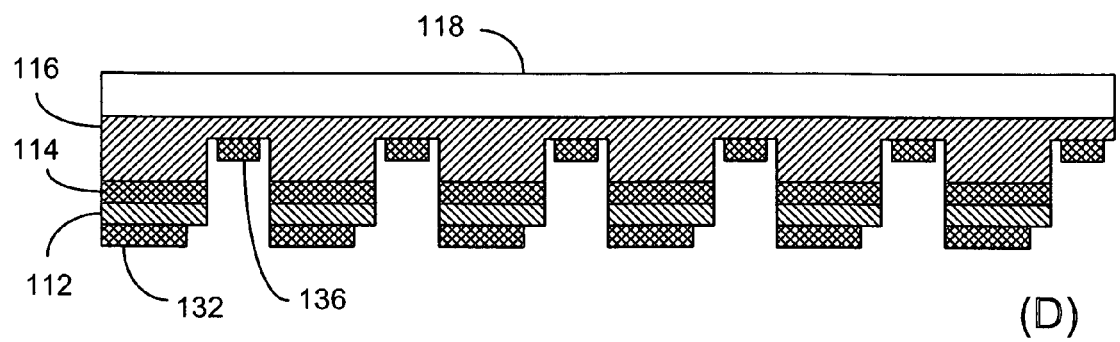
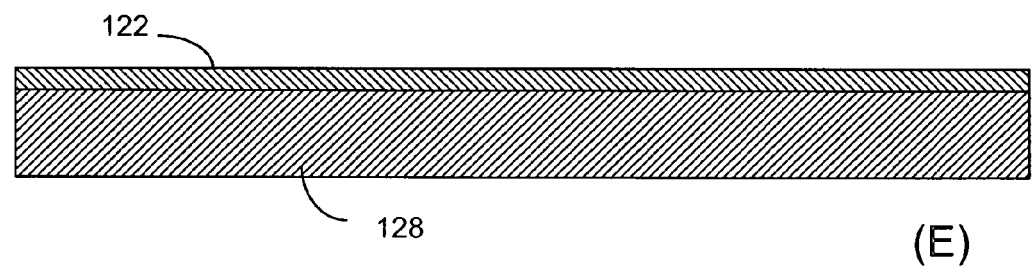
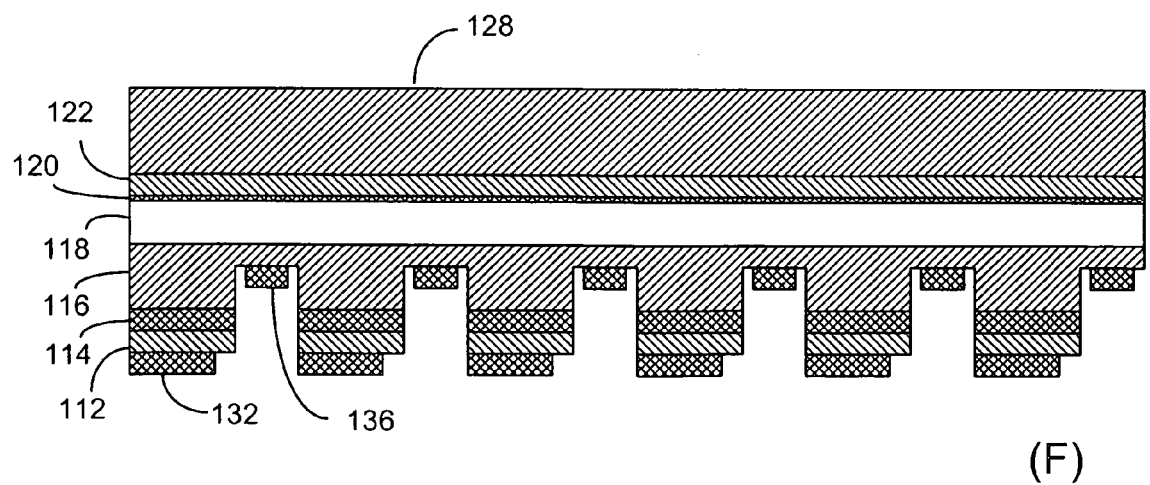
FIG. 2

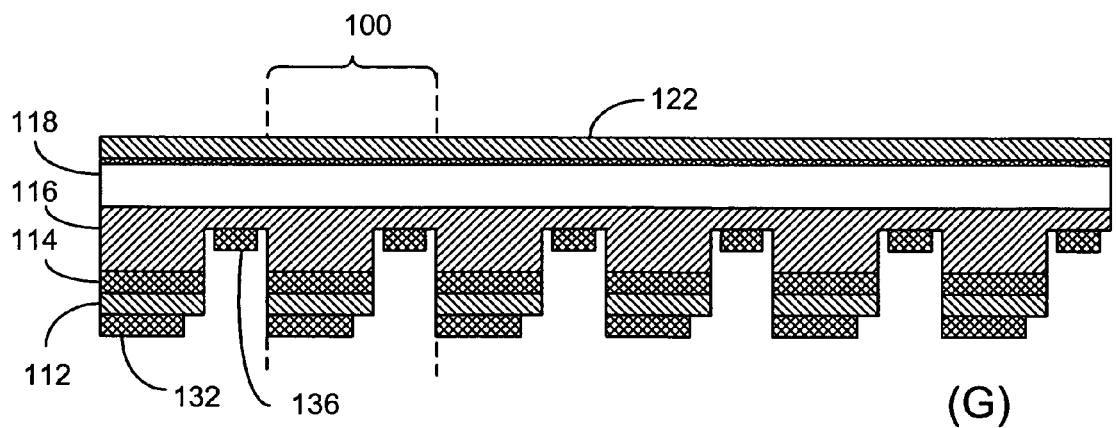
(G)
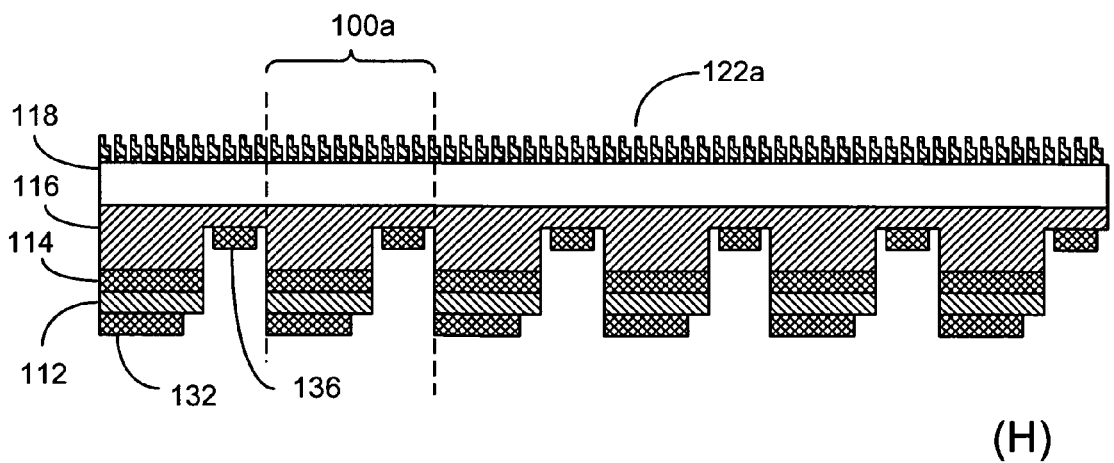
(H)
FIG. 2

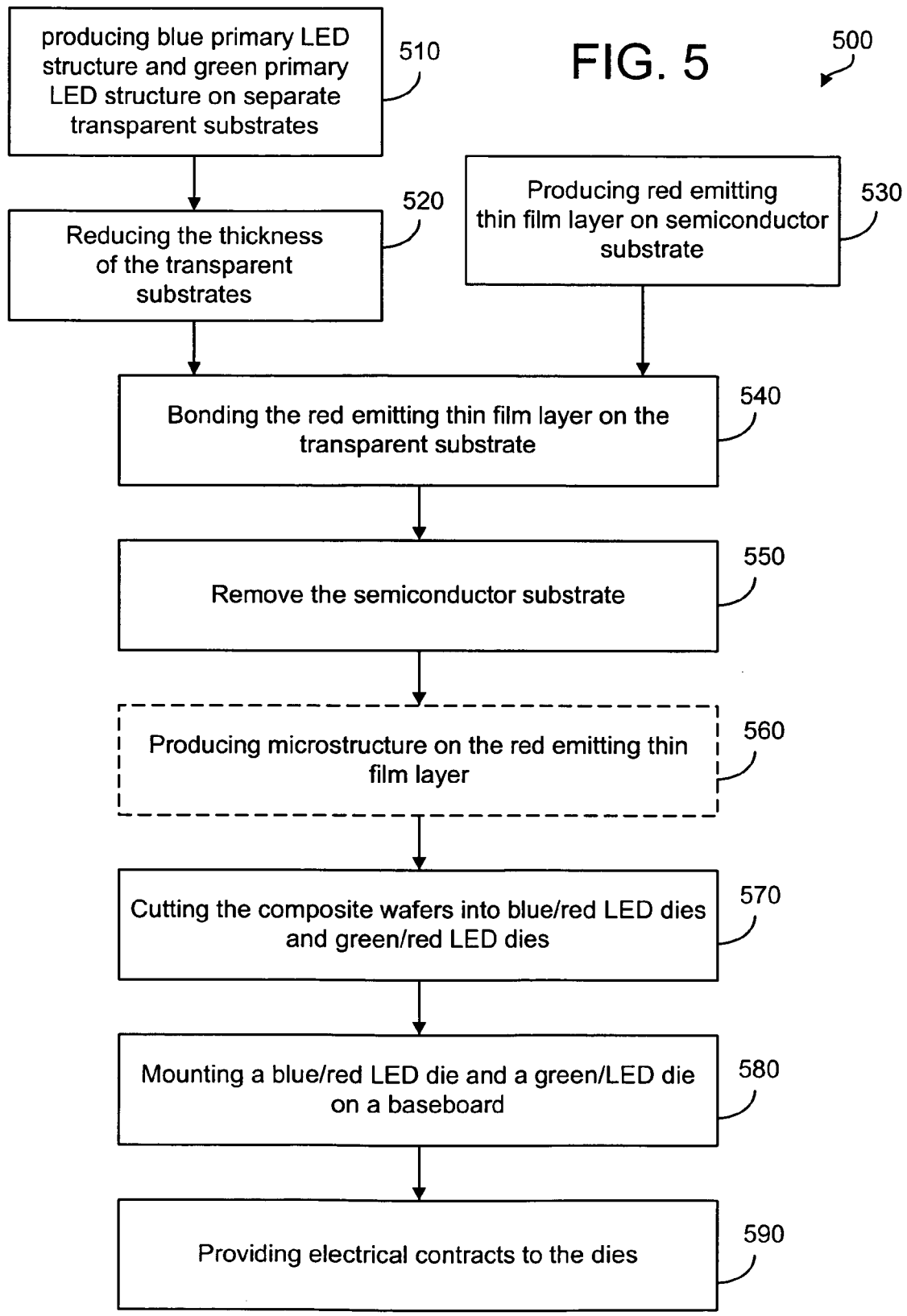

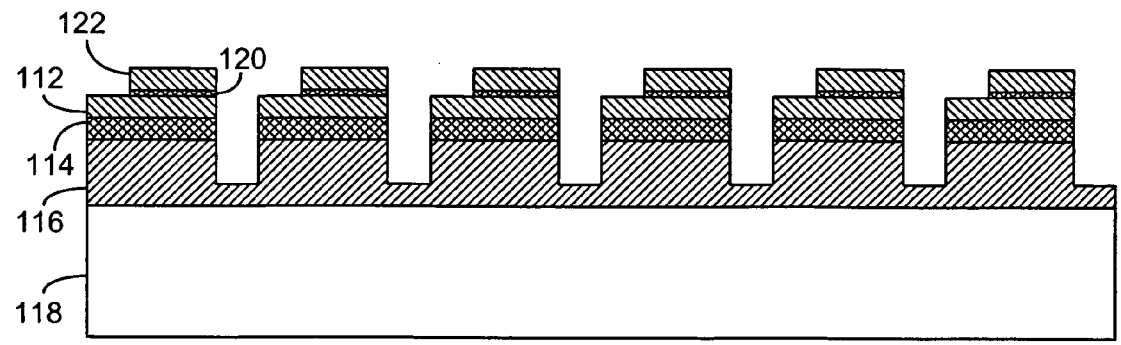
(E)
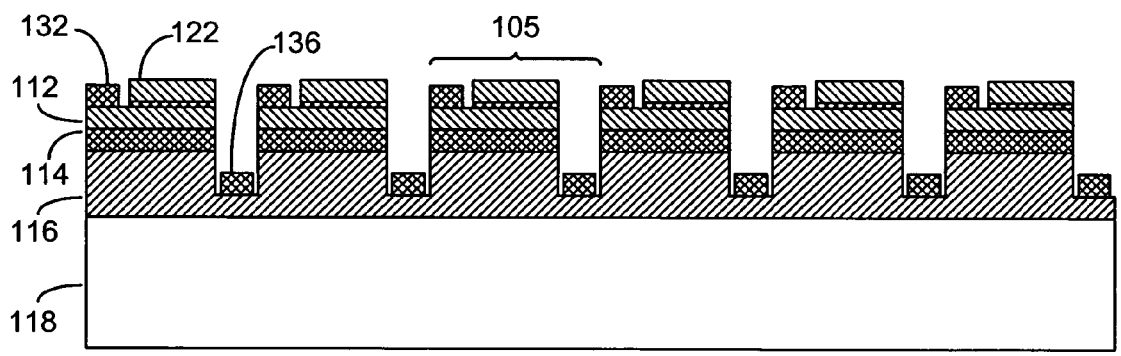
(F)
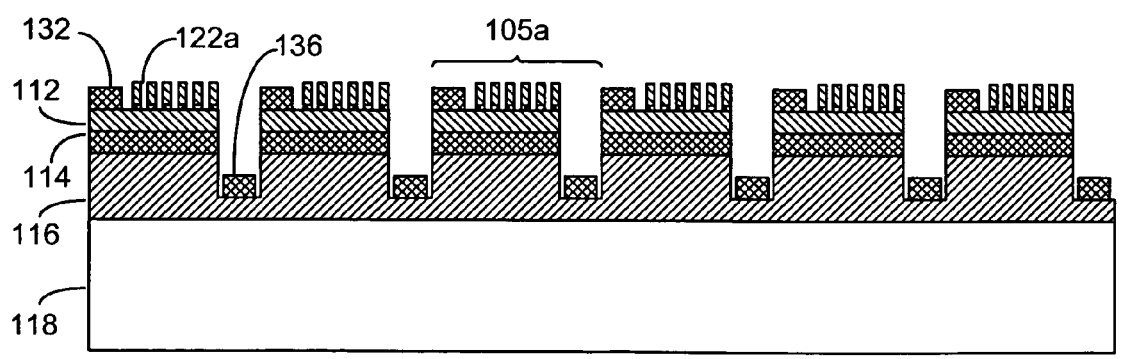
(G)
FIG. 6

WHITE LIGHT EMITTING DEVICE AND METHOD OF MAKING SAME

This application is a continuation of application Ser. No. 11/035,647 filed on Jan. 14, 2005 now U.S. Pat. No. 7,045,375.

FIELD OF THE INVENTION

The present invention pertains to the field of semiconductor opto-electronic devices. More specifically, the present invention pertains to white light emitting diodes.

BACKGROUND OF THE INVENTION

Light emitting diodes (LEDs) are special types of semiconductor diodes first developed in the 1960s. A simplest LED consists of a p-type semiconductor and an n-type semiconductor forming a p-n junction. When an electric current passes through the junction, it creates charge-carriers (electrons and holes). In the process, an electron combines with a hole and releases energy in the form of a photon. Most of today's high efficiency LEDs have one or more layers of light emitting materials sandwiched between the p- and n-type regions to improve the light emitting efficiency. The layer structure is also used to obtain desired emission wavelengths. The basic structure of an LED device consists of a small piece of such layered material, called a die, placed on a frame or a baseboard for electrical contacts and mechanical support. The die is also encapsulated for protection.

With an LED, the wavelength of the emitted light is determined by the bandgap energy of the light emitting material. One type of material suitable for LEDs is the compound semiconductors having bandgap energies corresponding to near infrared (IR), visible or near ultraviolet (UV) light. AlGaInP (Aluminum Gallium Indium Phosphide) is one of the LED materials that exhibit high quantum efficiency (hence high brightness) and versatile colors. The bandgap of $(Al_xGa_{1-x})_{1-y}In_yP$ alloy system varies, depending on the x and y in the composition. The color of AlGaInP LEDs ranges from green to red. AlGaInP LEDs must be fabricated on a lattice-matching gallium arsenide (GaAs) substrate using an epitaxial growth process, such as the metalorganic chemical vapor deposition (MOCVD).

In the 1990's violet, blue and green LEDs based on gallium nitride (GaN) materials were developed. GaN is a direct bandgap semiconductor with bandgap energy of ~3.4 eV. The electron-hole recombination in GaN leads to emission of photons at a wavelength of 360 nm, which is in the UV range. The visible wavelength LEDs (green, blue and violet) are achieved by using $In_zGa_{1-z}N$ as the light emitting layer, sandwiched between a p-type GaN layer and an n-type GaN layer. The wavelength $\lambda$ of the light emitted by the $In_zGa_{1-z}N$ LED system varies depending on the z value. For example, for pure blue color, $\lambda$=470 nm, z=0.2. The GaN LEDs must be fabricated on a lattice-matching substrate such as sapphire or silicon carbide (SiC), again using epitaxial growth processes such as MOCVD.

Great efforts have been made to produce white LEDs as a replacement for conventional lighting sources. Currently, white color LEDs can be accomplished in various ways:

(1) Putting discrete red, green and blue LEDs in a "lamp" and use various optical components to mix light in red, green and blue colors emitted by those discrete LEDs. However, because of the different operating voltages for LEDs of different colors, multiple control circuits are required. Furthermore, the lifetime of the LEDs is different from one color to another. Over time the combined color would change noticeably if one of the LEDs fails or is degrading.

(2) Partially converting light in short wavelengths to light in the longer wavelengths using phosphors. One of the most common ways is to cover a yellowish phosphor powder around a blue InGaN LED chip. The phosphor powder is usually made of cerium doped yttrium aluminum garnet (YAG:Ce) crystals. Part of the blue light emitted by the InGaN LED chip is converted to yellow by the YAG:Ce. However, the "white" light so produced contains mainly two colors: blue and yellow. Such a light source is usually used as indicator lamps.

(3) Using UV light produced by very short-wavelength LEDs to excite phosphors of different colors in order to produce light in three basic colors. The drawback of this method is that the lifetime of the UV LEDs is relatively short. Furthermore, UV radiation from the LEDs can be a health hazard, as most of commonly used encapsulation materials today are not effective in blocking UV radiation.

There have been numerous attempts in developing white LED light sources with higher efficiency and better chromaticity. Guo et al ("Photon-Recycling for High Brightness LEDs", Compound Semiconductor 6(4) May/June 2000) suggests the concept of photon recycling in producing high brightness white LEDs. Photon recycling is a process by which short wavelength photons are absorbed by an emitter material, which re-emits photons of long-wavelengths. In principle, photon recycling semiconductor (PRS) LEDs can efficiently produce white light up to 330 lumen/watt. However, the drawback of PRS-LEDs is their extremely low color-rendering index.

The dual-color PRS-LED, as disclosed in Guo et al., consists of a primary light source and a secondary light source. The secondary light source has a secondary light-emitting layer. The primary light source is used to produce blue light. The produced blue light is directed to the secondary emitting layer so that part of the blue light is absorbed in order to produce yellow light in the re-emitting process. In principle, the dual-color photon production in PRS-LEDs is analogous to the phosphor coated LED. However, unlike the phosphor coated LED, the secondary light source consists of a fluorescent semiconductor material, AlGaInP, directly bonded to the primary light source wafer. It is therefore possible to produce dual-color LED chips on a wafer. FIG. 1 shows the structure of a PRS-LED, according to Guo et al. As shown in FIG. 1, the PRS-LED 1 consists of a transparent substrate 18 made of sapphire. The primary light source and the secondary light source are disposed on opposite sides of the sapphire substrate. The primary light source comprises a p-type GaN layer 12, an active layer 14 made from InGaN and an n-type GaN layer 16. These layers are epitaxially grown on the sapphire substrate 18. The secondary light source LED consists of mainly a layer of AlGaInP 22. The AlGaInP layer is epitaxially grown on a GaAs substrate (not shown) and then bonded to the sapphire substrate 18 using a bonding material 20. The GaAs substrate is subsequently removed by chemically-assisted polishing and selective wet etching. After the primary light source layers are patterned, an n-type contact 36 made of Al is deposited on a section of the n-type GaN layer 16, and a p-type contact 32 of Ni is deposited on a section of the p-type GaN layer 12.

The primary light output is produced in the active region 14 by current injection, and the wavelength of the primary light is approximately 470 nm. In operation, a portion of the photons emitted by the primary light source is absorbed by the AlGaInP layer 22 and then re-emitted (or recycled) as photons of a longer wavelength. The composition of the AlGaInP layer 22 can be selected such that the re-emitted light is at the wavelength of 570 nm (yellow). Because the colors of the light produced by the primary light source and the secondary light source are complementary, the combined light output appears white to the human eye. In such a PRS-LED structure, while the white light contains emission peaks of 470 nm (blue) and 570 nm (yellow), no red light (~650 nm) is emitted.

The mixed light produced by the aforementioned methods may appear white to the human eye. However, the mixed light does not have the required chromaticity as required in a quality color display, such as an LCD display.

Thus, it is advantageous and desirable to provide a method to produce a semiconductor light source containing wavelength components in RGB.

SUMMARY OF THE INVENTION

The present invention combines color components in a first PSR-LED with different color components in a second PRS-LED to produce white-light in a white emitting device. The first PRS-LED has a primary light source to emit blue light and a secondary light source to emit red light responsive to the blue light; and the second PRS-LED has a primary light source to emit green light and a secondary light source for emitting red light responsive to the green light. Each of the primary light sources is made from an InGaN layer disposed between a p-type GaN layer and an n-type GaN layer. The secondary light sources are made from AlGaInP or $Ga_xIn_{1-x}P$. The primary light source and the secondary light source can be disposed on opposite sides of a sapphire substrate. Alternatively, the second light source is disposed on the n-type GaN layer of the primary light source. The second light sources may comprise micro-rods of AlGaInP of same or different compositions. AlGaN can also be used to replace p-GaN or n-GaN.

Thus, the first aspect of the present invention provides a method of producing a white-light emitting source, the white light comprising at least a first color component with a first wavelength, a second color component with a second wavelength, and a third color component with a third wavelength, the first wavelength shorter than the second wavelength, the second wavelength shorter than the third wavelength. The method comprises the steps of:

providing at least one first light emitting device, the first light emitting device comprising a first light source for emitting the first color component, and a second light source for emitting a part of the third color component responsive to the first color component;

disposing at least one second light emitting device adjacent to the first light emitting device, the second light emitting device having a first light source for emitting the second color component, and a second light source for emitting a further part of the third color component responsive to the second color component; and combining the first color component and said part of the third color component emitted by the first light emitting device to the second color component and said further part of the third color component so as to produce said white light.

According to the present invention, the first light source in the first light emitting device comprises:

a first active layer;

a hole source layer to provide holes to the first active layer; and an electron source layer to provide electrons to the first active layer so that at least part of the electrons combine with at least part of the holes in the first active layer to produce light of the first wavelength, and the first light source in the second light emitting device comprises:

a second active layer;

a hole source layer to provide holes to the second active layer; and an electron source layer to provide electrons to the second active layer so that at least part of the electrons combine with at least part of the holes in the second active layer to produce light of the second wavelength.

According to the present invention, the second light source in the first light emitting device and the second light source in the second light emitting device are made substantially from AlGaInP, or $Ga_xIn_{1-x}P$, where $0<x<1$;

the first and second active layers are made substantially from InGaN;

the hole source layers are made substantially from a p-type GaN; and the electron source layers are made substantially from an n-type GaN.

According to the present invention, the first color component is blue, the second color component is green and the third color component is red.

The second aspect of the present invention provides a light emitting device for emitting white-light of at least a first color component with a range of first wavelengths, a second color component with a range of second wavelengths and a third color component with a range of third wavelengths, the first wavelengths shorter than the second wavelengths, the second wavelengths shorter than the third wavelengths. The light emitting device comprises:

a mounting plate;

a first light emitting component disposed on the mounting plate, the first light emitting component comprising a first light source for emitting the first color component, and a second light source for emitting a part of the third color component responsive to the first color component; and a second light emitting component disposed on the mounting plate adjacent to the first light emitting component, the second light emitting component having a first light source for emitting the second color component, and a second light source for emitting a further part of the third color component responsive to the second color component.

According to the present invention, the first light source in the first light emitting component comprises:

a first active layer;

a hole source layer to provide holes to the first active layer; and an electron source layer to provide electrons to the first active layer so that at least part of the electrons combine with at least part of the holes in the first active layer to produce light of the first wavelength, and the first light source in the second light emitting component comprises:

a second active layer;

a hole source layer to provide holes to the second active layer; and an electron source layer to provide electrons to the second active layer so that at least part of the electrons combine with at least part of the holes in the second active layer to produce light of the second wavelength.

According to one embodiment of the present invention, the first active layer is disposed between the electron source layer and the hole source layer in the first light emitting component, and the hole source layer is disposed on a first side of a first transparent substrate and the second light source in the first light emitting component is disposed on a second side of the first transparent substrate, and wherein the second active layer is disposed between the electron source layer and the hole source layer in the second light emitting component, and the hole source layer is disposed on a first side of a second transparent substrate and the second light source in the second light emitting component is disposed on a second side of the second transparent substrate.

According to the present invention, one or more of the second light sources in the first light emitting component and the second light emitting component comprise a plurality of micro-rods of AlGaInP or $Ga_xIn_{1-x}P$, where $0<x<1$.

According to the present invention, the second light source in the first emitting component comprises a plurality of micro-rods of a first AlGaInP layer and a second AlGaInP layer, the first AlGaInP layer emitting light in one third wavelength and the second AlGaInP layer emitting light in another third wavelength.

According to the present invention, the hole source, the first active layer and the electron source layer in the first light emitting component are sequentially deposited on the first transparent substrate in an epitaxial growth process, and the second light source in the first light emitting component is bonded to the first transparent substrate via a bonding layer; and wherein the hole source, the second active layer and the electron source layer in the second light emitting component are sequentially deposited on the second transparent substrate in an epitaxial growth process, and the second light source in the second light emitting component is bonded to the second transparent substrate via a bonding layer, and in which:

the transparent substrate comprises a sapphire substrate;

the first and second active layers are made substantially from InGaN;

the hole source layers are made substantially from p-GaN; the electron source layer are made substantially from n-GaN, and the second light sources in the first and second light emitting components are made substantially from AlGaInP or $Ga_xIn_{1-x}P$, where $0<x<1$.

According to another embodiment of the present invention, the first active layer is disposed between the electron source layer and the hole source layer in the first light emitting component, the hole source disposed on a substrate, and the second light source in the first light emitting component is disposed on the electron source layer in the first light emitting component, and wherein the second active layer is disposed between the electron source layer and the hole source layer in the second light emitting component, the hole source disposed on a second substrate, and the second light source in the second light emitting component is disposed on the electron source layer in the second light emitting component, in which:

the first and second active layers are made substantially from InGaN;

the hole source layers are made substantially from p-GaN;

the electron source layer are made substantially from n-GaN, and the second light sources in the first and second light emitting components are made substantially from AlGaInP or $Ga_xIn_{1-x}P$, where $0<x<1$.

According to the present invention, the first color component is a blue color component, the second color component is a green color component, and the third color component is a red color component.

The present invention will become apparent upon reading the description taken in conjunction with FIGS. 2a–8.

BRIEF DESCRIPTION OF THE DRAWINGS

FIG. 2a to 2h illustrate the method of producing component LEDs, according to present invention, in which:

FIG. 2a shows various material layers disposed on a transparent substrate for producing the primary light source.

FIG. 2b shows the layers being patterned.

FIG. 2c shows the patterned layers having electrical contracts disposed thereon.

FIG. 2d shows the reduction of the transparent substrate thickness.

FIG. 2e shows an epitaxially grown AlGaInP layer on a semiconductor substrate.

FIG. 2f shows the AlGaInP layer bonded to the different side of the transparent substrate together with the semiconductor substrate.

FIG. 2g shows the removal of the semiconductor substrate from the bonded structure, leaving the AlGaInP layer as a secondary light source.

FIG. 2h shows the etching of the AlGaInP layer to produce a plurality of micro-rods in the secondary light source.

FIG. 3a to 3e illustrate different shapes of the micro-rods in the secondary light source; in which:

FIG. 3a shows a two-level micro-structure;

FIG. 3b shows a single-level micro-structure with micro-rods of uniform width.

FIG. 3c shows a single-level micro-structure wherein the base of the micro-rods is wider than the top;

FIG. 3d shows a single-level micro-structure wherein the base of the micro-rods is narrower than the base; and FIG. 3e shows a two-level micro-structure with two layers of different materials.

FIG. 5 is a flowchart illustrating the method to fabricate the white-light emitting device as shown in FIG. 2a–4c.

FIG. 6a to 6g illustrate another method of producing component LEDs, according to present invention, in which:

FIG. 6a shows various material layers disposed on a transparent substrate for producing the primary light source;

FIG. 6b shows an epitaxially grown AlGaInP layer on a semiconductor substrate;

FIG. 6c shows the AlGaInP layer bonded to the top layer of the primary light source layers;

FIG. 6d show the removal of the semiconductor substrate from the bonded structure, leaving the AlGaInP layer as a secondary light source;

FIG. 6e shows the patterned secondary and primary light source layers;

FIG. 6f shows the patterned layers having electrical contracts disposed thereon; and FIG. 6g shows the etching of the AlGaInP layer.

DETAILED DESCRIPTION OF THE INVENTION

Figure 1:
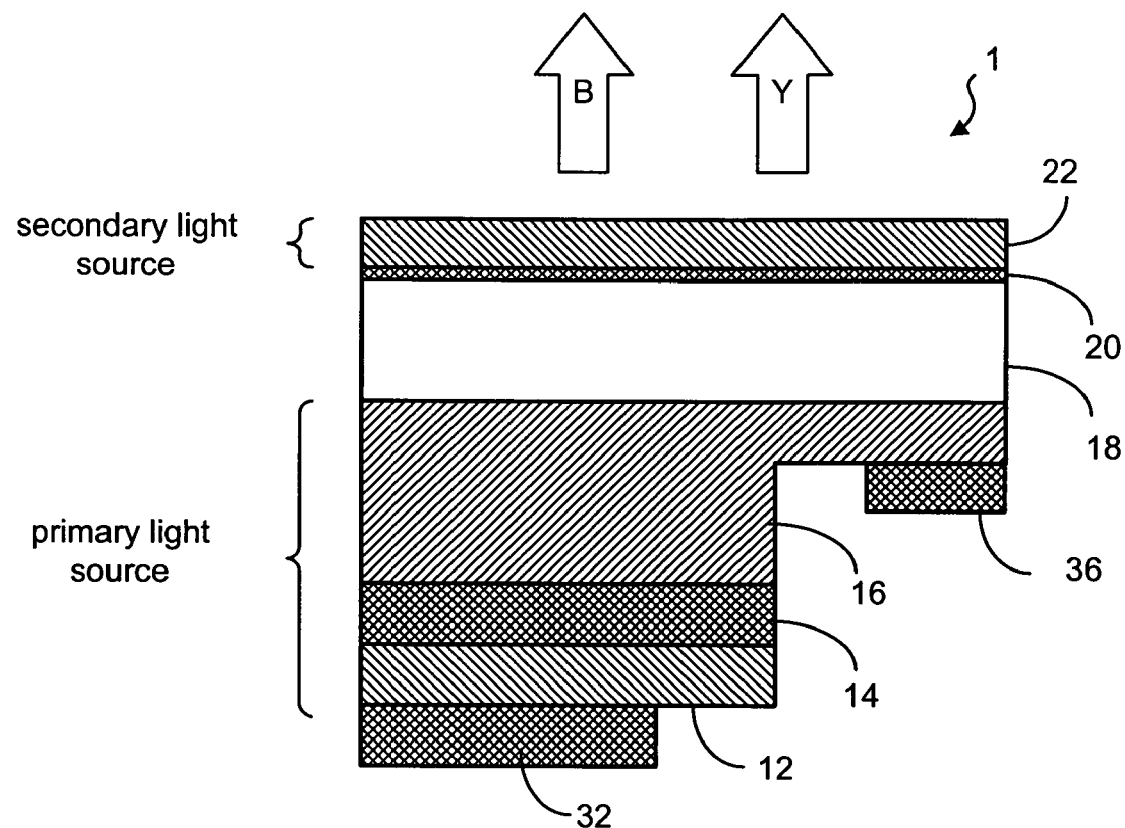
FIG. 1 is a schematic representation of a prior art white light LED.
Figure 2:
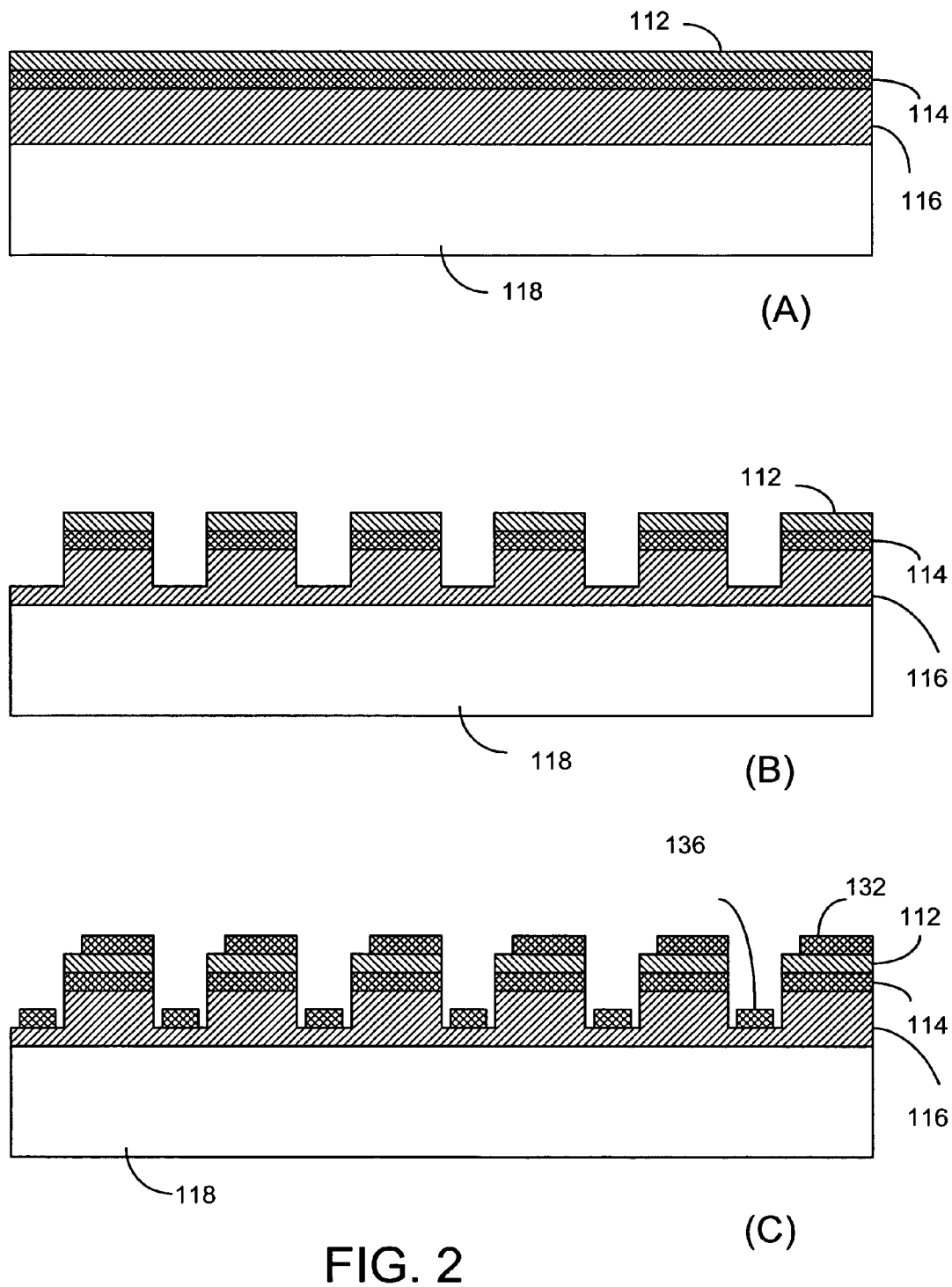

In order to achieve three primary colors red, green and blue in the white-light source, the present invention uses at least two discrete dual-color LEDs. A first dual-color LED emits red light and blue light, and a second dual-color LED emits red light and green light. As such, the combined light emission contains red light, green light and blue light. The present invention provides two distinct embodiments of the white-emitting light devices produced by two different methods. FIGS. 2a to 2h show a first method for producing dual-color LEDs, according to the present invention.

FIG. 2a shows various material layers disposed on a transparent substrate for producing a primary light source structure. As shown in FIG. 2a, an n-type GaN layer 116 is epitaxially grown on a sapphire substrate 118. A layer 114 of blue-light emitting InGaN is epitaxially grown on the n-type GaN layer 116 and then a p-type GaN layer 112 is epitaxially grown on the InGaN layer 114. The combined layers are then etched so as to produce a plurality of primary light source components, as shown in FIG. 2b. As shown in FIG. 2c, a plurality of electrical contacts 136 are provided on the p-type layer 112, and a plurality of electrical contacts 132 are provided on the n-type layer 116. The thickness of the sapphire substrate 118 can now be reduced to about 100 μm, as shown in FIG. 2d. Separately, an AlGaInP layer 122 is epitaxially grown on a semiconductor substrate, such as a GaAs wafer substrate 128, as shown in FIG. 2e. The AlGaInP layer 122 is bonded to the different side of the sapphire substrate 118 using a spin-on-glass (SOG) method, for example. The bonding layer between the AlGaInP layer 122 and the sapphire substrate 118 is denoted by reference numeral 120, as shown in FIG. 2f. In this illustrative example, the primary light source layers 112, 114 and 116 are chosen to emit blue light. Accordingly, the AlGaInP layer 122 is selected to produce red light as a secondary light source by absorbing the blue light emitted from the primary light source layers through the sapphire layer 118.

Now the semiconductor substrate 128 is removed by a $1NH_4OH:1H_2O_2:10H_2O$ solution in a wet etching process, as shown in FIG. 2g, in order to expose the AlGaInP layer 122. The processed layer structure can now be cut into small dies 100. While the height of the dies 100 is determined by the thickness of various layers, the area of the dies can be 300 μm×365 μm, for example. It should be noted that the thickness of the AlGaInP layer 122 can significantly affect the color and the light output of the dual-color LED die 100. If the AlGaInP layer 122 is too thick, the blue light may be excessively reduced by the absorption in the AlGaInP layer 122. If the layer 122 is too thin, the portion of the short wavelength photons being absorbed may be too small to produce enough red light from the AlGaInP layer in the re-emitting process. However, it is possible to adjust the relative amount of blue light and red light by selectively removing part of the AlGaInP layer 122. As shown in FIG. 2h, the AlGaInP layer 122 is patterned by various dry-etching techniques into a patterned AlGaInP layer 122a. The further processed layer structures can now be cut into a plurality of small dies 100a. It should be noted that each of the small dies 100a or 100 can be used as a blue-red emitting component in the white-light emitting device, according to the present invention. In order to produce the green-red emitting components, processes similar to those shown in FIGS. 2a to 2h are used except that the InGaN layer is now a green-emitting layer 114', and the AlGaInP layer is now a layer 122' for re-emitting red light after the absorption of green light.

Figure 3A:
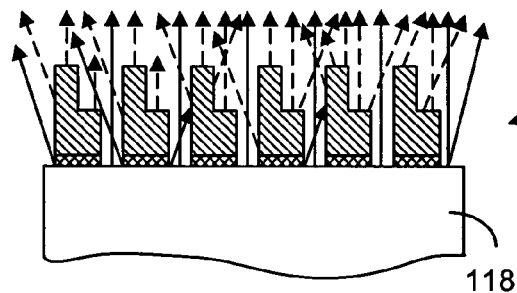
Figure 3B:
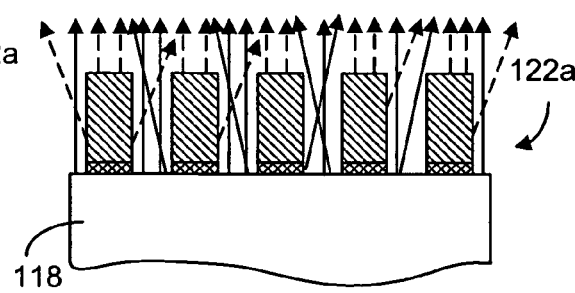
Figure 3C:
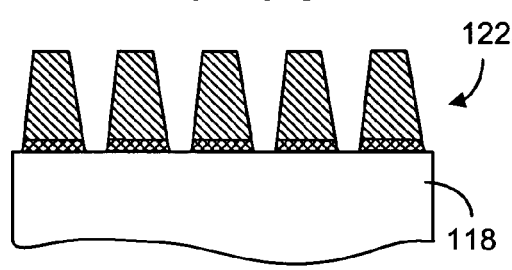
Figure 3D:
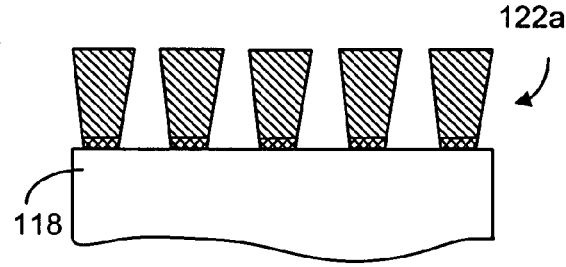
Figure 3E:
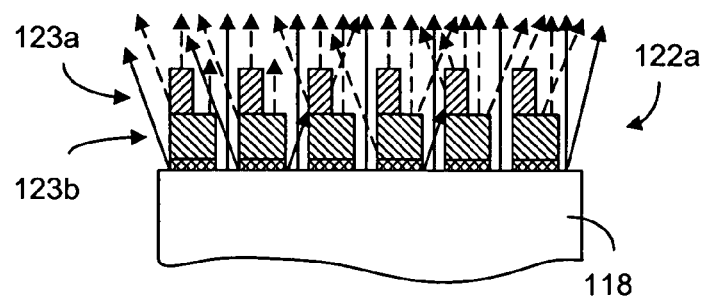

There is more than one way to pattern the AlGaInP layer 122 in order to improve the light emitting efficiency of the dual-color LEDs. For example, the AlGaInP layer 122 can be etched to form an array of two-level micro-rods as shown in FIG. 3a, or single-level micro-rods as shown in FIG. 3b. The single-level micro-rods can have different shapes. For example, the base of the single-level micro-rods can be wider than the top of the micro-rods, as shown in FIG. 3c. Alternatively, the top of the single-level micro-rods can be wider than the base of the micro-rods, as shown in FIG. 3d. The structured AlGaInP layer is denoted by reference numeral 122a. It should be noted that the two-level micro-rods can be made substantially of the same AlGaInP composition, as shown in FIG. 3a. However, they can also be two layers 123a, 123b made from AlGaInP of different compositions, as shown 3e. For example, one layer emits light at 630 nm and the other at 670 nm. These different compositions improve the color rendering ability of the white light-emitting device. It is understood that the shapes and the sizes of the micro-rods shown in FIGS. 3a–3d are for illustrative purposes only. The micro-rods need not be regular or retain a certain geometrical shape. The main purpose of etching the AlGaInP layer 122 is to adjust the relative amount of light produced by the primary light source to that by the secondary light source through the top of the dual-color LED.

Figure 4A:
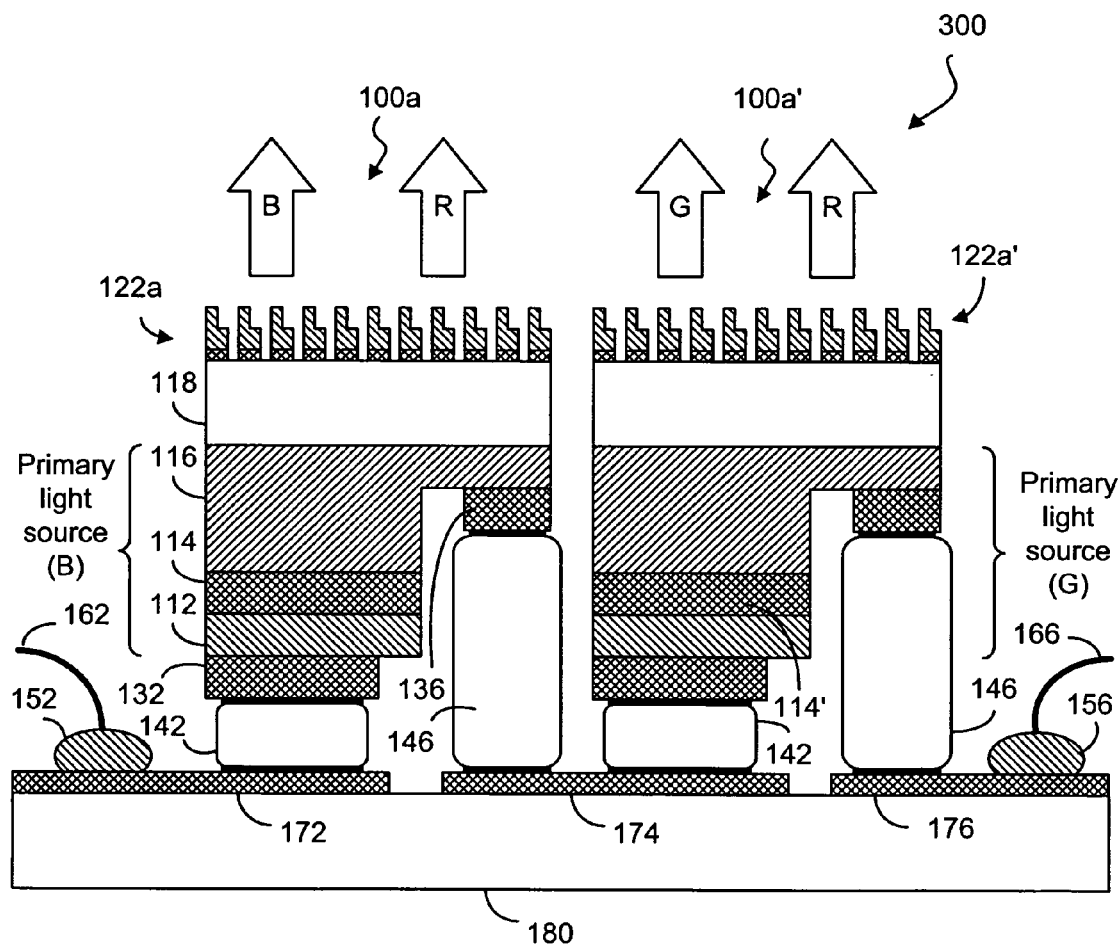
FIG. 4a is a schematic representation showing the white-light emitting device, according to one embodiment of the present invention.
Figure 4B:
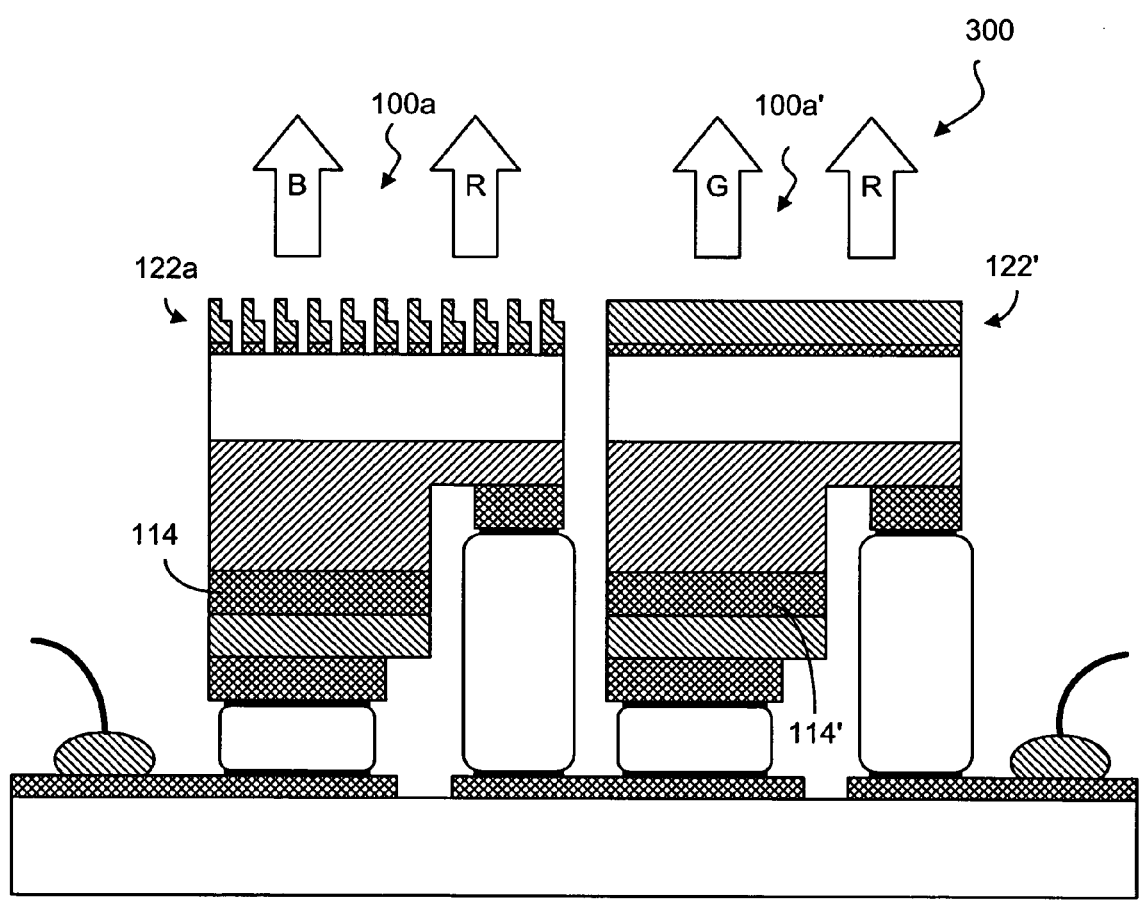
FIG. 4b is a schematic representation showing the white-light emitting device, according to another embodiment of the present invention.

The white-light emitting device, according to one embodiment of the present invention, is shown in FIG. 4a. As shown, the white-light emitting device 300 comprises at least one blue-red emitting LED 100a and one green-red emitting LED 100a'. Both LEDs 100a and 100a' are mounted on various electrically conductive sections 172, 174 and 176 on a baseboard 180. Electrical contacts 152, 156 and wire bonds 162, 166 are further provided on the baseboard so as to provide an electrical current through the LEDs connected in series. Alternatively, only one of the dual-color LEDs has a patterned AlGaInP layer 122a, as shown in FIG. 4b. It is also possible that the AlGaInP layer 122 on each of the dual-color LEDs 100, 100' be an un-etched layer, as shown in FIG. 4c.

FIG. 5 is a flowchart illustrating the method to produce the white-light emitting device 300, according to the present invention. As shown in the flowchart 500, a step 510 is used to produce a blue LED layer structure on a sapphire substrate (see FIG. 2a) and a green LED layer structure on a different sapphire substrate. The step 520 is used to reduce the thickness of the sapphire substrate (see FIG. 2d). The step 530 is used to produce a red emitting thin film layer on a semiconductor substrate (see FIG. 2e). The red emitting thin film layer is bonded to a different side of the sapphire substrate at step 540 (see FIG. 2f) and the semiconductor substrate is removed from the bonded structure at step 550 (see FIG. 2g). It may be desirable to pattern the red emitting thin film layer at an optional step 560 (see FIG. 2h). The combined blue-red emitting layer structure and the combined green-red emitting layer structure are cut into smaller dies at step 570.

Figure 4C:
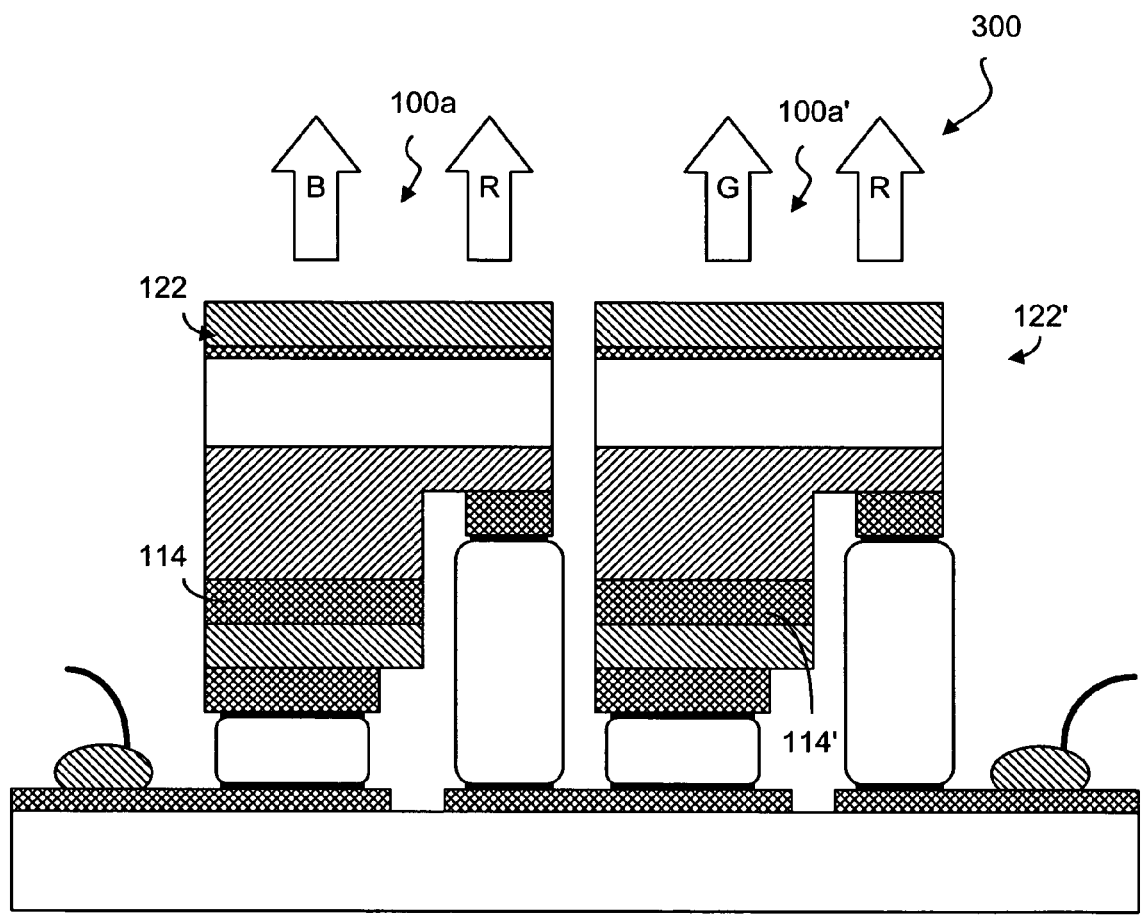
FIG. 4c is a schematic representation showing the white-light emitting device, according to another embodiment of the present invention.

At least one blue-red LED component and one green-red LED component are mounted on a baseboard at step 580 and electrical contacts are provided to the dies at step 590 (see FIG. 4a–4c).

FIGS. 6a to 6g show a second method for producing dual-color LEDs, according to the present invention.

Figure 6:
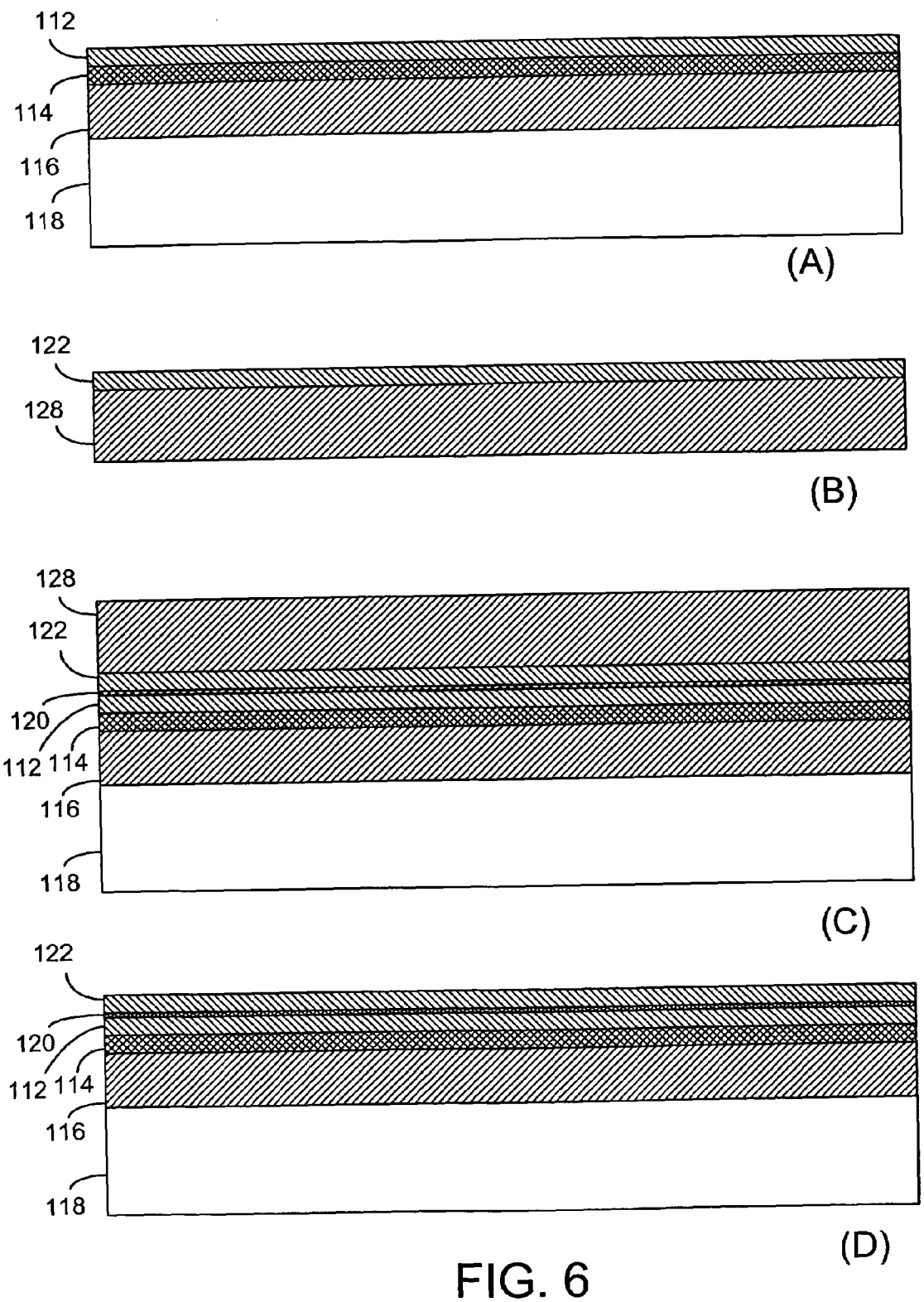

FIG. 6a shows various material layers disposed on a transparent substrate for producing a primary light source structure. As shown in FIG. 6a, an n-type GaN layer 116 is epitaxially grown on a sapphire substrate 118. A layer 114 of blue-light emitting InGaN is epitaxially grown on the n-type GaN layer 116 and then a p-type GaN layer 112 is epitaxially grown on the InGaN layer 114. Separately, an AlGaInP layer 122 is epitaxially grown on a semiconductor substrate, such as a GaAs wafer substrate 128, as shown in FIG. 6b. The AlGaInP layer 122 is bonded to the top of the primary light source layers—the p-type GaN layer 112, as shown in FIG. 6c. The bonding layer between the AlGaInP layer 122 and p-type GaN layer 112 is denoted by reference numeral 121, as shown in FIG. 6c. In this illustrative example, the primary light source layers 112, 114 and 116 are chosen to emit blue light. Accordingly, the AlGaInP layer 122 is selected to produce red light as a secondary light source by absorbing the blue light emitted from the primary light source layers through the sapphire layer 118.

Now the semiconductor substrate 128 is removed by a 1NH$_4$OH:1H$_2$O$_2$:10H$_2$O solution in a wet etching process, as shown in FIG. 6d, in order to expose the AlGaInP layer 122. The bonded structure is further patterned so as to produce a plurality of dual-color LED components, as shown in FIG. 6e and electrical contacts 132, 136 are provided, respectively, to the p-type layer 112 and the n-type layer 116 as shown in FIG. 6f. The processed layer structure can now be cut into small dies 105. It may be desirable to remove part of the AlGaInP layer 122 in order to adjust the relative amount of light emitted by the primary light source to that by the secondary light source through the AlGaInP layer 122. As shown in FIG. 6g, the AlGaInP layer 122 is patterned by various dry-etching techniques into a patterned AlGaInP layer 122a. The further processed layer structures can now be cut into a plurality of small dies 105a. Each of the small dies 105a or 105 can be used as a blue-red emitting component in the white-light emitting device, according to the present invention. In order to produce the green-red emitting components, processes similar to those shown in FIGS. 6a to 6g are used except that the InGaN layer is now a green-emitting layer 114', and the AlGaInP layer is now a layer 122' for re-emitting red light after the absorption of green light.

Figure 7A:
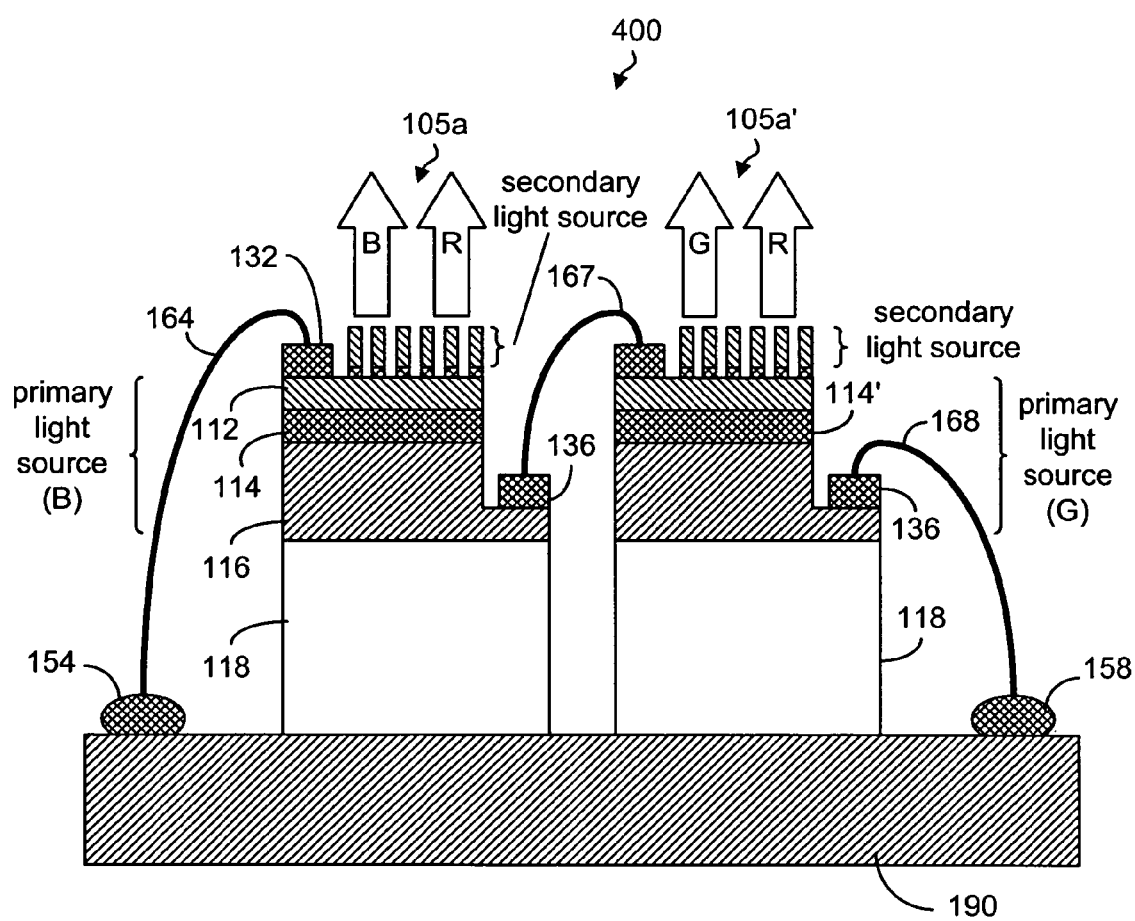
FIG. 7a is a schematic representation showing a white-light emitting device, according to a different embodiment of the present invention.
Figure 7B:
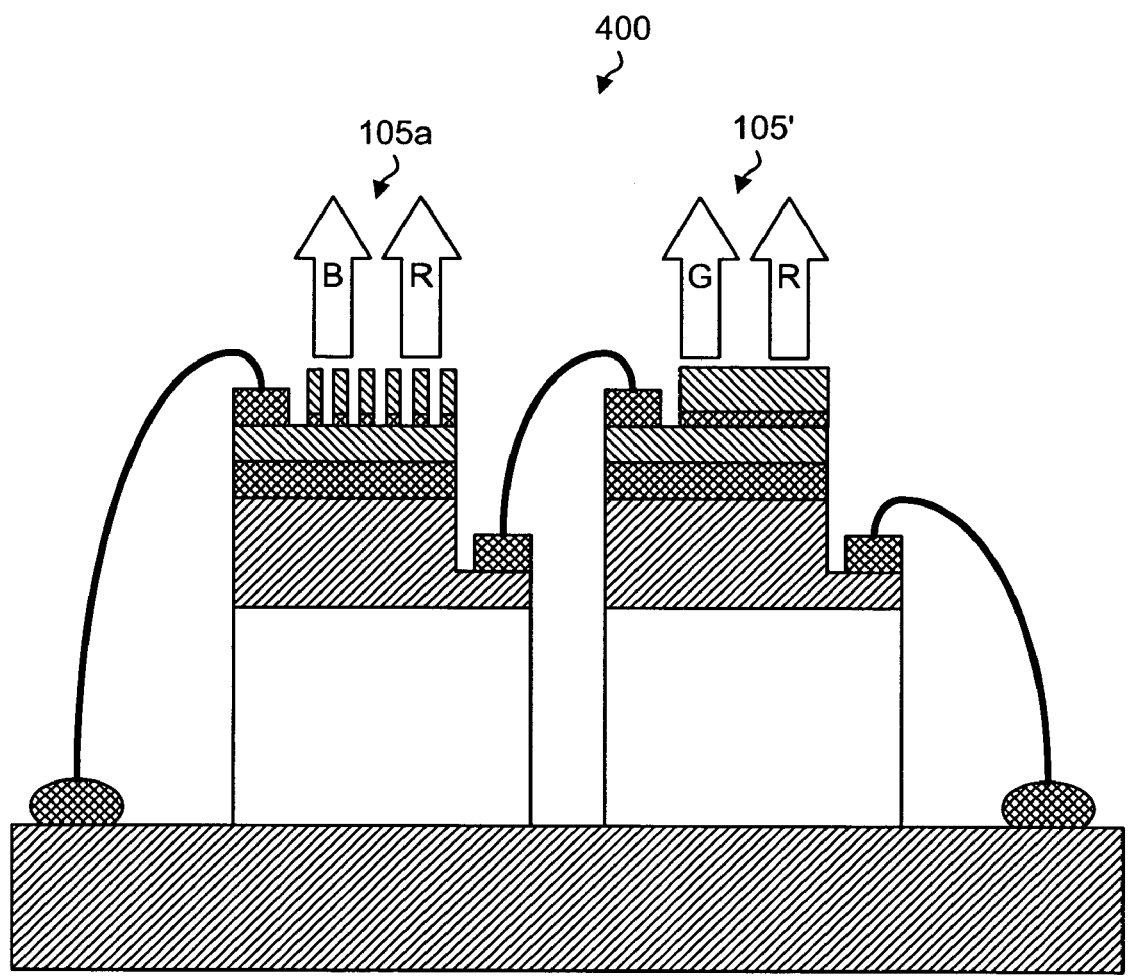
FIG. 7b is a schematic representation showing a white-light emitting device, according to another different embodiment of the present invention.
Figure 7C:
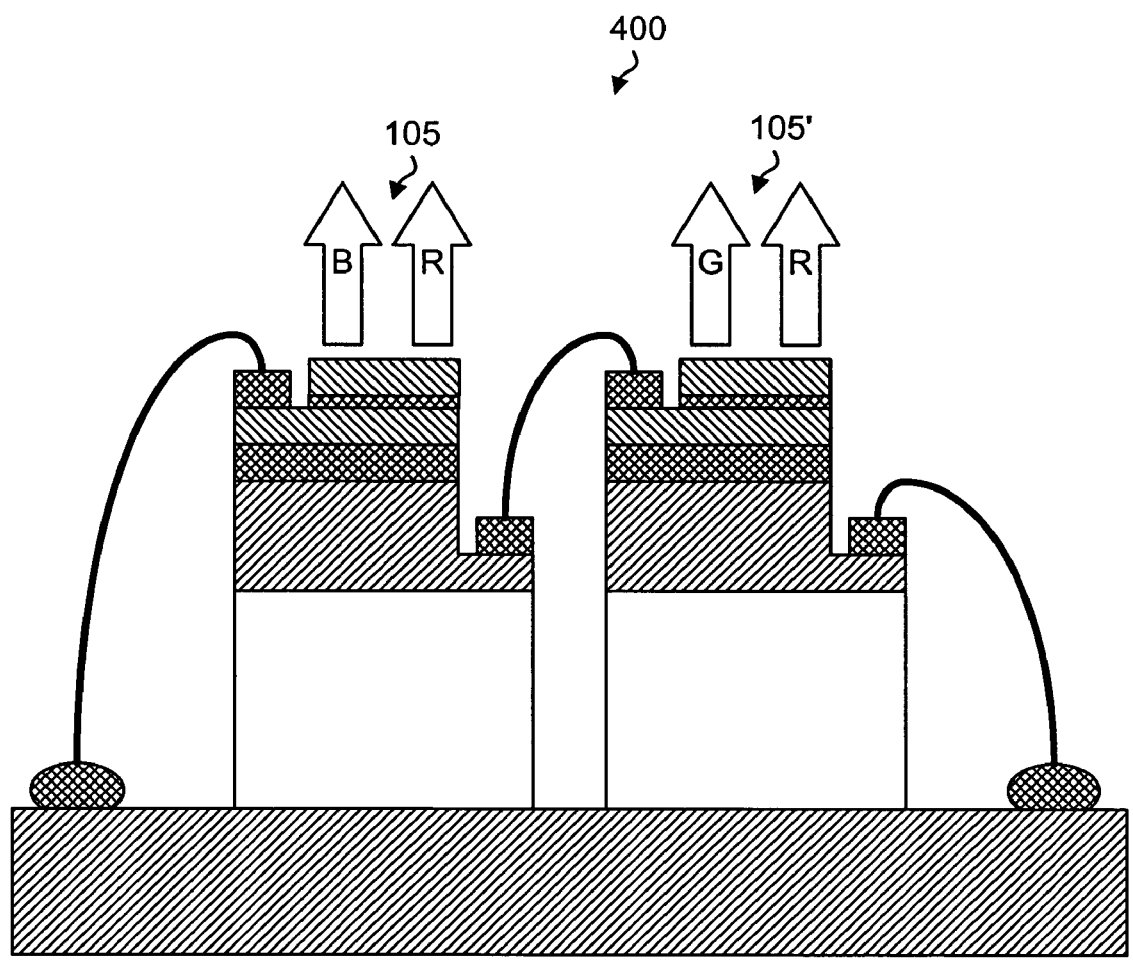
FIG. 7c is a schematic representation showing a white-light emitting device, according to yet another different embodiment of the present invention.

The white-light emitting device, according to this second embodiment of the present invention, is shown in FIG. 7a. As shown, the white-light emitting device 400 comprises at least one blue-red emitting LED 105a and one green-red emitting LED 105a'. Both LEDs 105a and 105a' are on a baseboard 190. Electrical contacts 154, 158 and wire bonds 164, 167 and 168 are further provided on the baseboard 190 and various contacts 132, 136 so as to provide an electrical current through the LEDs connected in series. Alternatively, only one of the dual-color LEDs has a patterned AlGaInP layer 122a, as shown in FIG. 7b. It is also possible that the AlGaInP layer 122 on each of the dual-color LEDs 105, 105' be an un-etched layer, as shown in FIG. 7c.

Figure 8:
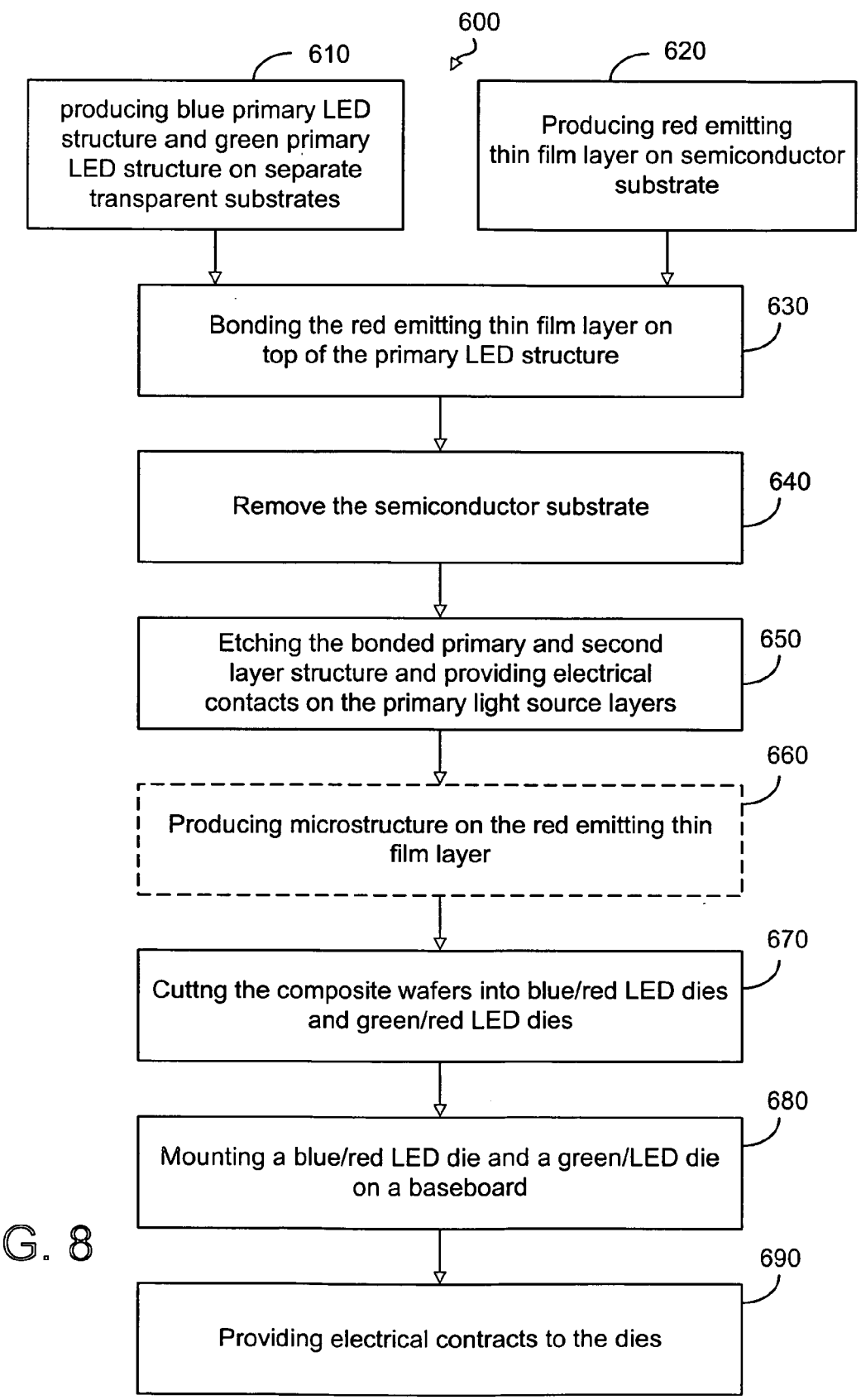
FIG. 8 is a flowchart illustrating the method to fabricate the white-light emitting device as shown in FIG. 6a–7c.

FIG. 8 is a flowchart illustrating the method to produce the white-light emitting device 400, according to the present invention. As shown in the flowchart 600, a step 610 is used to produce a blue LED layer structure on a sapphire substrate (see FIG. 6a) and a green LED layer structure on a different sapphire substrate. The step 620 is used to produce a red emitting thin film layer on a semiconductor substrate (see FIG. 6b). The red emitting thin film layer is bonded to the top of the primary light source layer at step 630 (see FIG. 6c) and the semiconductor substrate is removed from the bonded structure at step 640 (see FIG. 6d). The combined secondary and primary light emitting layers are patterned and then provided electrical contacts at step 650 (see FIGS. 6e and 6f). It may be desirable to pattern the red emitting thin film layer at an optional step 660 (see FIG. 6g). The combined blue-red emitting layer structure and the combined green-red emitting layer structure are cut into smaller dies at step 670. At least one blue-red LED component and one green-red LED component are mounted on a baseboard at step 680 and electrical contacts are provided to the dies at step 690 (see FIG. 7a–7c).

It should be noted that each of the dual-color LEDs 100, 105, 100', 105' has a primary light source and a secondary light source. In the dual-color LEDs 100, 100', the primary light source and the secondary light source are disposed on different side of the transparent substrate 118. In order to reduce the loss of the light emitted by the primary light source by absorption in the substrate 118, the thickness of the substrate 118 is reduced to approximately 100 μm. In the dual-color LEDs 105, 105', the primary light source and the secondary light source are disposed on the same side of the transparent substrate 118, with the secondary light source bonded to the top layer of the primary light source. It would not be necessary to reduce the thickness of the transparent substrate 118.

It should be appreciated by person skilled in the art that the red light emitting layer 122 (FIGS. 2e–4c and 6b–6g, for example) can be also made of Ga$_x$In$_{1-x}$P, where 0<x<1. Furthermore, the p-GaN layer 112 is a hole source for providing holes to the active layer 114, and the n-GaN layer 116 is an electron source for providing electrons to the active layer 114 so that part of the holes combine with part of the electrons in the active layer 114 to produce blue or green light. AlGaN can also be used in some cases to replace p-GaN in the hole source layer 112 and to replace n-GaN in the electron source layer 116.

In sum, the white-light emitting device of the present invention comprises at least one blue-red LED and one green-red LED. These LEDs can be electrically connected in series. In one embodiment of the present invention, the dual-color LED comprises a primary light source and a secondary light source disposed on different sides of a transparent substrate. In the other embodiment of the present invention, the dual-color LED comprises a primary light source disposed on a substrate and a secondary light source bonded to the primary light source. It should be noted that it is possible to have more than one blue-red LED disposed in one white-light emitting device, according to the present invention. Likewise, it is also possible to have more than one green-red LED disposed in one white-light emitting device. The number of the dual-color LEDs in one white-light emitting device partially depends upon the desirable white-light intensity and partially upon the relative amount in the light components in RGB.

Although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A method of producing a white-light emitting source, the white light comprising at least a first color component with a first wavelength, a second color component with a second wavelength, and a third color component, said method comprising the steps of:
   disposing a first light emitting device on a first side of a first transparent substrate, the first light emitting device comprising a first light source for emitting the first color component;
   disposing a second light emitting device on a first side of a second transparent substrate, the second light emitting device comprising a second light source for emitting the second color component;
   disposing a third light emitting device on at least one semiconductor substrate;
   separately bonding a second side of the first transparent substrate to the third light-emitting device for forming a first light emitting structure and bonding a second side of the second transparent substrate to the third light-emitting device for forming a second light emitting structure;
   removing said at least one semiconductor substrate from the first light emitting structure for providing a reduced first light emitting structure;
   removing said at least one semiconductor substrate from the second light emitting structure for providing a reduced second light emitting structure;
   dividing the reduced first light emitting structure into a plurality of first combined light-emitting dies;
   dividing the reduced second light emitting structure into a plurality of second combined light-emitting dies;
   mounting at least one first combined light-emitting die and at least one second combined light-emitting die on a baseboard; and
   providing electrical contacts to said at least one first combined light-emitting die and said at least one second combined light-emitting die.

2. The method of claim 1, further comprising the step of:
   reducing the thickness of the first transparent substrate and the thickness of the second transparent substrate prior to said bonding.

3. The method of claim 1, further comprising the step of:
   producing microstructure on the third light emitting device after removing said at least one semiconductor substrate from the first light emitting structure for providing a reduced first light emitting structure and removing said at least one semiconductor substrate from the second light emitting structure for providing a reduced second light emitting structure.

4. The method of claim 1, wherein the first light-emitting device comprises:
   a first active layer;
   a hole source layer to provide holes to the first active layer; and
   an electron source layer to provide electrons to the first active layer so that at least part of the electrons combine with at least part of the holes in the first active layer to produce light of the first wavelength, and wherein the second light-emitting device comprises:
   a second active layer;
   a hole source layer to provide holes to the second active layer; and
   an electron source layer to provide electrons to the second active layer so that at least part of the electrons combine with at least part of the holes in the second active layer to produce light of the second wavelength.

5. The method of claim 4, wherein
   the first and second active layers are made substantially of InGaN;
   the hole source layers are made substantially of a p-type GaN; and
   the electron source layers are made substantially of an n-type GaN.

6. The method of claim 1, wherein the third light-emitting device is made substantially from AlGaInP.

7. The method of claim 1, wherein the third light-emitting device is made substantially of $Ga_xIn_{1-x}P$, where $0<x<1$.

8. The method of claim 1, wherein the third light-emitting device is made substantially of $Ga_xIn_{1-x}P$, where $0.3<x<0.7$.

9. The method of claim 1, wherein the third light-emitting device comprises a plurality of micro-rods made substantially of AlGaInP or $Ga_xIn_{1-x}P$, where $0.3<x<0.7$.

10. The method of claim 1, wherein the third light-emitting device comprises a plurality of micro-rods of a first AlGaInP layer and a second AlGaInP layer, the first AlGaInP layer emitting light in one third wavelength and the second AlGaInP layer emitting light in another third wavelength.

11. A method of producing a white-light emitting source, the white light comprising at least a first color component with a first wavelength, a second color component with a second wavelength, and a third color component, said method comprising the steps of:
   disposing a first light emitting device on a first side of a first transparent substrate, the first light emitting device comprising a first light source for emitting the first color component;
   disposing a second light emitting device on a first side of a second transparent substrate, the second light emitting device comprising a second light source for emitting the second color component;
   disposing a third light emitting device on at least one semiconductor substrate;
   separately bonding a second side of the first transparent substrate to the third light-emitting device for forming a first light emitting structure and bonding a second side of the second transparent substrate to the third light-emitting device for forming a second light emitting structure;
   removing said at least one semiconductor substrate from the first light emitting structure for providing a reduced first light emitting structure;
   removing said at least one semiconductor substrate from the second light emitting structure for providing a reduced second light emitting structure;
   patterning the reduced first and second light-emitting structures into patterned first and second light-emitting structures;
   providing electrical contacts in the patterned first and second light emitting structures;
   dividing the patterned first light emitting structure into a plurality of first combined light-emitting dies;
   dividing the patterned second light emitting structure into a plurality of second combined light-emitting dies;
   mounting at least one first combined light-emitting die and at least one second combined light-emitting die on a baseboard; and
   providing electrical contacts to said at least one first combined light-emitting die and said at least one second combined light-emitting die.

12. The method of claim 11, further comprising the step of:
   producing microstructure on the third light emitting device after removing said at least one semiconductor substrate from the first light emitting structure for providing a reduced first light emitting structure and removing said at least one semiconductor substrate from the second light emitting structure for providing a reduced second light emitting structure.

13. The method of claim 11, wherein the first light-emitting device comprises:
a first active layer;
a hole source layer to provide holes to the first active layer; and
an electron source layer to provide electrons to the first active layer so that at least part of the electrons combine with at least part of the holes in the first active layer to produce light of the first wavelength, and wherein the second light-emitting device comprises:
a second active layer;
a hole source layer to provide holes to the second active layer; and
an electron source layer to provide electrons to the second active layer so that at least part of the electrons combine with at least part of the holes in the second active layer to produce light of the second wavelength.

14. The method of claim 13, wherein
the first and second active layers are made substantially of InGaN;
the hole source layers are made substantially of a p-type GaN; and
the electron source layers are made substantially of an n-type GaN.

15. The method of claim 11, wherein the third light-emitting device is made substantially from AlGaInP.

16. The method of claim 11, wherein the third light-emitting device is made substantially of $Ga_xIn_{1-x}P$, where $0<x<1$.

17. The method of claim 11, wherein the third light-emitting device is made substantially of $Ga_xIn_{1-x}P$, where $0.3<x<0.7$.

18. The method of claim 11, wherein the third light-emitting device comprise a plurality of micro-rods made substantially of AlGaInP or $Ga_xIn_{1-x}P$, where $0.3<x<0.7$.

19. The method of claim 11, wherein the third light-emitting device comprises a plurality of micro-rods of a first AlGaInP layer and a second AlGaInP layer, the first AlGaInP layer emitting light in one third wavelength and the second AlGaInP layer emitting light in another third wavelength.

20. A light emitting device for emitting white-light of at least a first color component with a range of first wavelengths, a second color component with a range of second wavelengths and a third color component with a range of third wavelengths, the first wavelengths shorter than the second wavelengths, the second wavelengths shorter than the third wavelengths, said light emitting device comprising:
a mounting plate;
a first light emitting component disposed on the mounting plate, the first light emitting component comprising a first light source for emitting the first color component, and a second light source for emitting a part of the third color component responsive to the first color component; and
a second light emitting component disposed on the mounting plate adjacent to the first light emitting component, the second light emitting component having a first light source for emitting the second color component, and a second light source for emitting a further part of the third color component responsive to the second color component, wherein the first active layer is disposed between the electron source layer and the hole source layer in the first light emitting component, and the hole source layer is disposed on a first side of a first transparent substrate and the second light source in the first light emitting component is disposed on a second side of the first transparent substrate, and wherein the second active layer is disposed between the electron source layer and the hole source layer in the second light emitting component, and the hole source layer is disposed on a first side of a second transparent substrate and the second light source in the second light emitting component is disposed on a second side of the second transparent substrate, and wherein the second light source in the first light emitting component is substantially made of AlGaInP or $Ga_xIn_{1-x}P$, where $0.3<x<0.7$.

21. The device of claim 20, wherein the second light source in the second light emitting component is substantially made of AlGaInP or $Ga_xIn_{1-x}P$, where $0.3<x<0.7$.

* * * * *